United States Patent [19]
Lee

[11] Patent Number: 5,781,054
[45] Date of Patent: Jul. 14, 1998

[54] DIGITAL PHASE CORRECTING APPARATUS

[75] Inventor: Jae-kon Lee, Anyang, Rep. of Korea

[73] Assignee: Samsung Electronics Co., Ltd., Kyungki-Do, Rep. of Korea

[21] Appl. No.: 797,895

[22] Filed: Feb. 10, 1997

[30] Foreign Application Priority Data

Feb. 8, 1996 [KR] Rep. of Korea ............... 96-3047

[51] Int. Cl.$^6$ ........................................... H03D 3/18
[52] U.S. Cl. .................. 327/231; 327/235; 375/373; 375/374; 375/376
[58] Field of Search ................... 327/231, 235; 375/373, 374, 376

[56] References Cited

U.S. PATENT DOCUMENTS

| | | | |
|---|---|---|---|
| 4,600,895 | 7/1986 | Landsman | 331/1 |
| 4,654,864 | 3/1987 | Ichiyoshi | 327/231 |
| 5,012,198 | 4/1991 | Okada et al. | 328/155 |
| 5,268,936 | 12/1993 | Bernardy | 327/231 |
| 5,271,040 | 12/1993 | Clark | 327/231 |

FOREIGN PATENT DOCUMENTS

| | | | |
|---|---|---|---|
| 1 348 546 | 7/1971 | Germany | H03L 3/04 |
| 2 073 515 | 3/1981 | United Kingdom | H03L 7/08 |

*Primary Examiner*—David C. Nelms
*Assistant Examiner*—Vu A. Le
*Attorney, Agent, or Firm*—Sughrue, Mion, Zinn, Macpeak & Seas, PLLC

[57] ABSTRACT

The present invention relates to a digital phase correcting apparatus, including a phase comparator (100), a loop filter (110), and a digital controlled oscillator (120). The digital controlled oscillator (120) includes a phase clock signal generator (400), a multiplexer (410), an up/down counter (430), and a frequency divider (420). The phase clock signal generator (400) receives the master clock signal as an input and generates therefrom a plurality of clock signals having a phase difference of half a period of the master clock signal. The multiplexer (410) selects and outputs one of the clock signals generated in the phase clock signal generator (400). The up/down counter (430) receiving a phase lead/lag signal of the loop filter (110) and provides an output select signal for the multiplexer (410). The frequency divider divides the frequency of the clock signal output from the multiplexer and outputting the phase locked clock signal to the phase comparator. According to the present invention, it is possible to improve the degree of precision and the jitter characteristics of the PLL by a factor of two since the phase locked clock signal can be changed by a unit of a half period of the master clock signal.

4 Claims, 3 Drawing Sheets

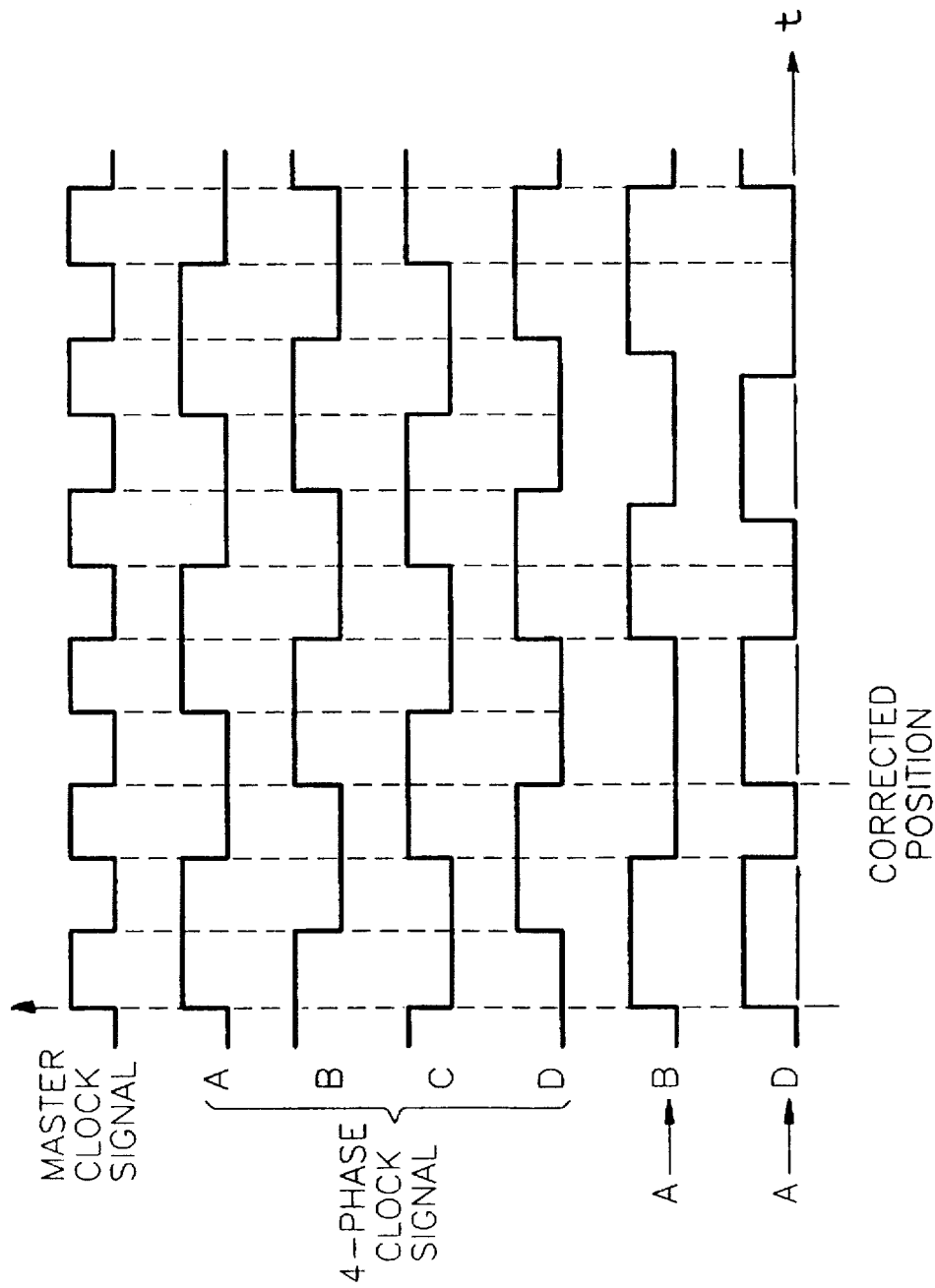

DIGITAL PHASE CORRECTING APPARATUS

BACKGROUND OF THE INVENTION

The present invention relates to a phase correcting apparatus. More particularly, it relates to a digital phase correcting apparatus in which the correction output from a digitally controlled oscillator is equal to a half period of a master clock signal. This application for a digital phase correcting apparatus is based on Korean Patent Application No. 96-3047 which is incorporated herein for all purposes.

FIG. 1 is a block diagram showing the general structure of a digital phase locked loop (PLL), which includes a phase comparator 100, a loop filter 110, and a digitally controlled oscillator 120. The phase comparator 100 detects the phase difference between an input reference clock signal and a phase locked clock signal. The loop filter 110 has a low pass filter characteristic and outputs a signal corresponding to how much the phase difference leads or lags in phase, by which a frequency division rate is determined. The digitally controlled oscillator 120 divides the frequency of an input master clock signal according to the frequency division rate and generates the phase locked clock signal.

FIG. 2 is a block diagram showing the structure of the digitally controlled oscillator 120. A multiplexer 200 selects and outputs the frequency division rate according to the phase lead/phase lag signal of the loop filter 110 and the selected frequency division rate and the master clock signal are input to a programmable frequency divider 210. The phase locked clock signal whose frequency is divided through the frequency divider 220 is input to the phase comparator 100.

FIG. 3 shows a sample output Si, where I=n−1, n, n+1 of the programmable frequency divider 210 when n is 4. As shown in FIG. 3, the unit of the output correction of a conventional digital controlled oscillator is one period of the master clock signal. The degree of precision and jitter characteristics of the PLL are deteriorated since the unit of the correction corresponds to one period of the master clock signal.

SUMMARY OF THE INVENTION

It is an object of the present invention to provide a digital phase correcting apparatus in which the correction output from a digitally controlled oscillator is equal to a half period of a master clock signal.

To achieve the above object, there is provided a digital phase correcting apparatus including a phase comparator, a loop filter, and a digitally controlled oscillator. The phase comparator detects a phase difference between a reference clock signal and a phase locked clock signal. The loop filter has the characteristics of a low pass filter and outputs a signal corresponding to how much the phase difference leads or lags in phase, by which a frequency division rate is determined. The digitally controlled oscillator generates the phase locked clock signal by dividing the frequency of an input master clock signal according to the frequency division rate.

The digitally controlled oscillator comprises: a phase clock signal generator, a multiplexer, an up/down counter, and a frequency divider. The phase clock signal generator inputs the master clock signal and generates at least one clock signal having a phase difference of half a period of the master clock signal. The multiplexer selects and outputs one of the at least one clock signal generated in said phase clock signal generator. The up/down counter receives the lead and lag signal of phase of the loop filter and provides an output select signal for said multiplexer. The frequency divider divides the frequency of the clock signal output from said multiplexer and outputs the phase locked clock signal to the phase comparator.

BRIEF DESCRIPTION OF THE DRAWINGS

The above object and advantages of the present invention will become more apparent by describing in detail a preferred embodiment thereof with reference to the attached drawings in which:

FIG. 5 is a timing diagram showing operation of the digitally controlled oscillator according to the present invention.

DETAILED DESCRIPTION OF THE INVENTION

Figure 1:
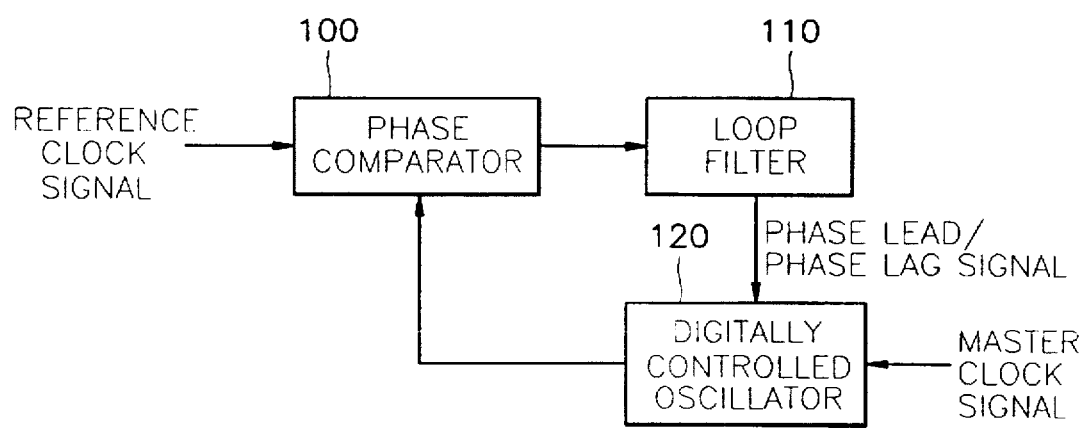
FIG. 1 is a block diagram showing the general structure of a digital phase locked loop (PLL)
Figure 2:
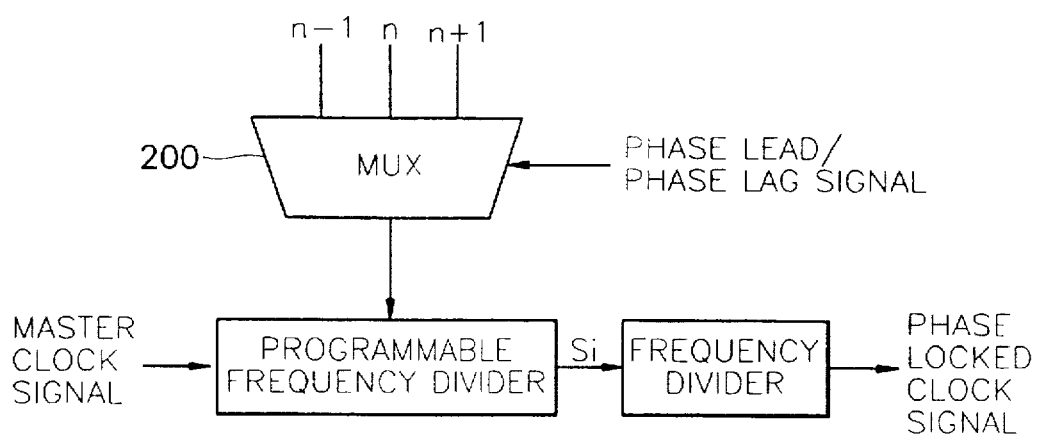
FIG. 2 is a block diagram showing the structure of a digitally controlled oscillator.
Figure 3:
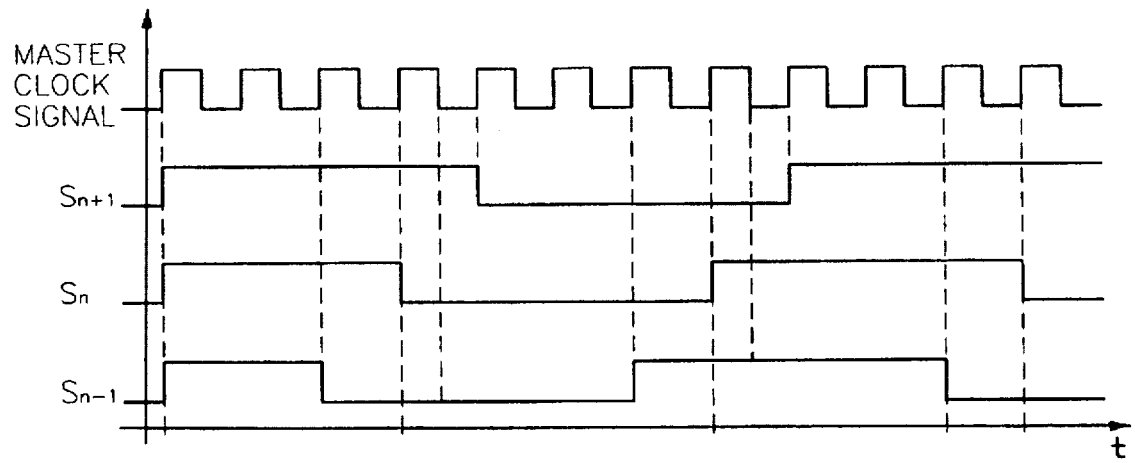
FIG. 3 is a timing diagram which shows an example output of a programmable frequency divider when n is 4.
Figure 4:
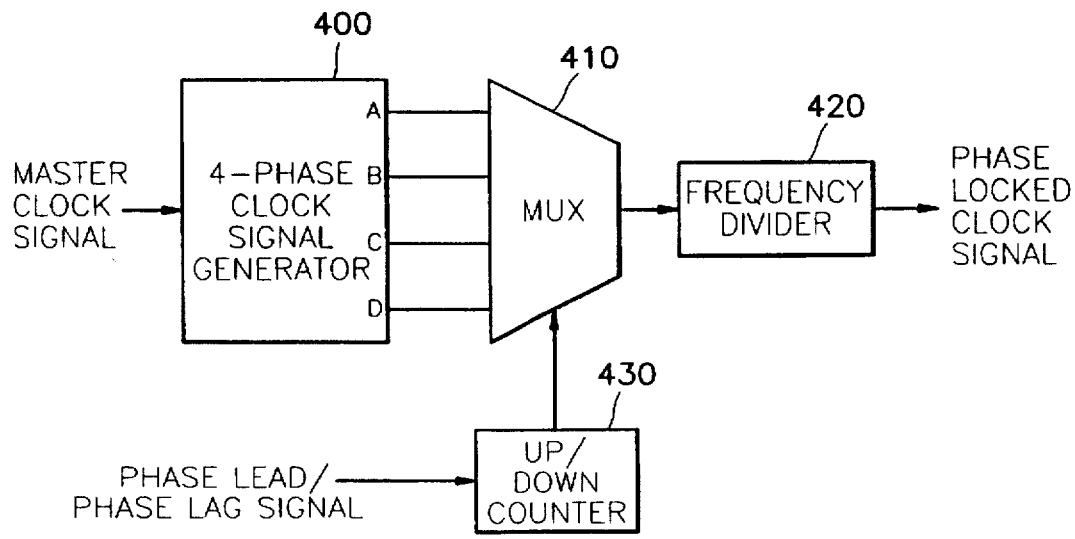
FIG. 4 is a block diagram showing the structure of a digitally controlled oscillator which forms a digital phase correcting apparatus according to the present invention.

FIG. 4 is a block diagram showing an embodiment of the digitally controlled oscillator 120 which forms the digital phase correcting apparatus according to the present invention. The digitally controlled oscillator 120 includes a four-phase clock signal generator 400, a multiplexer 410, an up/down counter 430, and a frequency divider 420.

The four-phase clock signal generator 400 inputs a master clock signal and generates a clock signal having four different phases, for example clock signals A, B, C and D, shown in FIG. 5. The multiplexer 410 selects and outputs one of the signals generated by the four-phase clock signal generator 400 according to an output select signal from the up/down counter 430.

The up/down counter 430 receives a phase lead/phase lag signal of the loop filter 110 and provides the output select signal to the multiplexer 410. The frequency divider 420 divides the frequency of the clock signal output from the multiplexer 410 and outputs a phase locked clock signal to the phase comparator 100.

When the master clock signal is input to the four-phase clock signal generator 400, four clock signals A, B, C and D having successive phase differences of a half period of the master clock signal are generated and are input to the multiplexer 410. Then, the up/down counter 430, which receives a phase lead/lag signal from the loop filter 110 as an input, selects an adjacent signal in the order of A-B-C-D-A or A-D-C-B-A among the clock signals of A, B, C and D by differentiating the output of the up/down counter 430 according to the phase lead/lag signal. The phase correction of a half period unit of the master clock signal is performed. For example, waveforms for the phase correction of clock signal are shown in FIG. 5 as A→B and A→D.

According to the invention, it is possible to improve the degree of precision and the jitter characteristics of the PLL by a factor of two since the phase locked clock signal can be changed to a half period unit of the master clock signal. Namely, it is possible to generate a desired phase locked clock signal with twice the frequency of the master clock signal.

Although the present invention has been described with reference to a preferred embodiment, it will be appreciated by those skilled in the art that various changes and modifications may be made to the described embodiment without departing from the spirit and scope of the present invention.

What is claimed is:

1. A digital phase correcting apparatus including a phase comparator for detecting a phase difference between a reference clock signal and a phase locked clock signal, a loop filter having the characteristics of a low pass filter for outputting a lead and lag signal of a phase which determines a frequency division rate, and a digitally controlled oscillator for generating the phase locked clock signal by dividing the frequency of an input master clock signal according to the frequency division rate, wherein said digitally controlled oscillator comprises:

a phase clock signal generator inputting the master clock signal and for generating at least one clock signal having a phase difference of half a period of the master clock signal;

a multiplexer for selecting and outputting one of the at least one clock signal generated in said phase clock signal generator;

an up/down counter for receiving the lead and lag signal of phase of the loop filter and providing an output select signal for said multiplexer; and a frequency divider for dividing the frequency of the clock signal output from said multiplexer and outputting the phase locked clock signal to the phase comparator.

2. A digital phase correcting apparatus as claimed in claim 1, wherein said phase clock signal generator is a four-phase clock signal generator which generates four clock signals having a phase difference of a half period of the master clock signal.

3. A digital phase correcting apparatus including a phase comparator for detecting a phase difference between a reference clock signal and a phase locked clock signal, a loop filter having the characteristics of a low pass filter for outputting a lead and lag signal of a phase which determines a frequency division rate, and a digitally controlled oscillator for generating the phase locked clock signal by dividing the frequency of an input master clock signal according to the frequency division rate, wherein said digitally controlled oscillator comprises:

a phase clock signal generator which receives the master clock signal at its input and generates at least one clock signal having a phase difference of half a period of the master clock signal;

an up/down counter which receives the lead and lag signal of a phase of the loop filter and provides a count output as an output select signal;

a multiplexer which receives said at least one clock signal as signal inputs and which receives said output select signal as a signal select input, and which generates as an output one of said at least one clock signal; and a frequency divider which receives the clock signal output from said multiplexer and divides that frequency down to produce the phase locked clock signal for output to the phase comparator.

4. A digital phase correcting apparatus as claimed in claim 3, wherein said phase clock signal generator is a four-phase clock signal generator which generates four clock signals having a phase difference of a half period of the master clock signal.

\* \* \* \* \*